United States Patent
Jin et al.

(10) Patent No.: US 9,160,355 B2
(45) Date of Patent: Oct. 13, 2015

(54) PRINTED CIRCUIT BOARD AND SIGNAL TIMING CONTROL METHOD THEREOF

(71) Applicants: Inventec (Pudong) Technology Corporation, Shanghai (CN); INVENTEC CORPORATION, Taipei (TW)

(72) Inventors: Xin-Guo Jin, Shanghai (CN); Hui-Yi Wu, Shanghai (CN); Lian-Yin Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 346 days.

(21) Appl. No.: 13/780,974

(22) Filed: Feb. 28, 2013

(65) Prior Publication Data
US 2014/0111260 A1    Apr. 24, 2014

(30) Foreign Application Priority Data
Oct. 22, 2012    (CN) .......................... 2012 1 0406258

(51) Int. Cl.
*G06F 13/12* (2006.01)
*H03L 9/00* (2006.01)
*G05B 19/04* (2006.01)

(52) U.S. Cl.
CPC *H03L 9/00* (2013.01); *G05B 19/04* (2013.01); *G06F 13/12* (2013.01)

(58) Field of Classification Search
USPC .......... 713/400, 401, 500, 503; 716/113, 134, 716/136
See application file for complete search history.

(56) References Cited

U.S. PATENT DOCUMENTS

| | | | | | |
|---|---|---|---|---|---|
| 5,727,021 | A | * | 3/1998 | Truebenbach | 375/226 |
| 6,000,038 | A | * | 12/1999 | Scepanovic et al. | 713/500 |
| 6,009,248 | A | * | 12/1999 | Sato et al. | 716/114 |
| 6,230,302 | B1 | * | 5/2001 | Gabele et al. | 716/102 |
| 7,284,216 | B2 | * | 10/2007 | Tsai et al. | 716/112 |
| 2002/0180517 | A1 | * | 12/2002 | Bosnyak et al. | 327/564 |
| 2011/0103533 | A1 | * | 5/2011 | Conway | 375/359 |

* cited by examiner

*Primary Examiner* — Khanh Dang
(74) *Attorney, Agent, or Firm* — Locke Lord LLP; Tim Tingkang Xia, Esq.

(57) ABSTRACT

A printed circuit board includes a sending element, a plurality of receiving elements, and a control unit. The sending element is configured to generate a sending signal. The receiving elements are configured to receive a control signal respectively. The control unit is coupled to the sending element through a first wire and to the receiving elements through a plurality of second wires. The control unit is provided with a comparison table that stores related information of the second wires. When receiving the sending signal, the control unit generates the control signals according the related information of the second wires. At least one of the control signals is transmitted to the corresponding receiving element, and the rest of the control signals are delayed for a preset time and then transmitted to the rest of the receiving elements.

6 Claims, 3 Drawing Sheets

PRINTED CIRCUIT BOARD AND SIGNAL TIMING CONTROL METHOD THEREOF

CROSS-REFERENCE TO RELATED APPLICATIONS

This non-provisional application claims priority under 35 U.S.C. §119(a) on Patent Application No(s). 201210406258.2 filed in China on Oct. 22, 2012, the entire contents of which are hereby incorporated by reference.

BACKGROUND

1. Technical Field

The disclosure relates to a printed circuit board (PCB), and more particularly to a PCB and a signal timing control method thereof.

2. Related Art

During the manufacturing of a printed circuit board (PCB), a circuit layout is usually implemented first to generate an electronic file of a layout diagram. In other words, a layout engineer places electronic elements in preset positions on the PCB, and connects the electronic elements to each other via wires, so as to accomplish the design of the layout diagram. Then, gerber out is performed according to the electronic file of the layout diagram, so as to generate a mask pattern. At last, a PCB manufacturer manufactures the PCB by using the mask pattern.

FIG. 1 illustrates a schematic partial diagram of a common PCB. To synchronize the signal timing so that the time of sending a signal from an element 111 to an element 112 is the same as the time of sending a signal from the element 111 to an element 113, the layout engineer may design the wire between the element 111 and the element 112 and the wire between the element 111 and the element 113 to have the same length. However, it is impossible that the distance between the elements 111 and 112 is the same as that between the elements 111 and 113 on the layout of the PCB 100. The layout engineer may design a longer wire 121 (the wire between the elements 111 and 112) to be straight, and design a shorter wire 122 (the wire between the element 111 and the element 113) to be S shaped, so that the wire 121 and the wire 122 have the same length, thereby synchronize the signal timing.

However, the layout mode of setting the wires to have the same length increases the complexity of the layout design, and the time and efficiency of the layout, and also wastes the utilizable space of the PCB. Therefore, it is necessary to develop the PCB having the signal timing synchronization.

SUMMARY

A PCB according to the disclosure comprises a sending element, a plurality of receiving elements, and a control unit. The sending element is configured to generate a sending signal. The receiving elements are configured to receive a control signal respectively. The control unit is coupled to the sending element through a first wire and to the receiving elements through a plurality of second wires. The control unit is provided with a comparison table that stores related information of the second wires. When receiving the sending signal, the control unit generates the control signals according to the related information of the second wires. At least one of the control signals is transmitted to the corresponding receiving element, and the rest of the control signals are delayed for a preset time and then transmitted to the rest of the receiving elements.

In an embodiment, the related information of the second wires comprises lengths of the second wires and transmission rates of the control signals transmitted in the second wires. Moreover, the preset time is obtained through dividing a difference value between a first length and a second length by a transmission rate of one delayed control signal transmitted in the corresponding second wire, the first length is a length of the second wire which the corresponding control signal which is not delayed is transmitted in, the second length is a length of the second wire which the corresponding control signal which is delayed is transmitted in, and the first length is greater than the second length.

In an embodiment, the related information of the second wires comprises periods that the control signals are respectively transmitted to the receiving elements. Moreover, the preset time is a difference value between a first period and a second period, the first period corresponds to a period of the control signal which is not delayed, the second period corresponds to a period of the control signal which is delayed, and the first period is greater than the second period.

In an embodiment, the control unit transmits a plurality of test signals to the receiving elements, the receiving elements respectively generate a response signal according to the test signals, the control unit calculates the related information of the second wires corresponding to the receiving elements according to the response signals, and stores the related information of the second wires.

The disclosure provides a signal timing control method, comprising the following steps. A control unit receives, through a first wire, a sending signal generated by a sending element. A plurality of control signals are generated according to related information about a plurality of second wires coupled to the control unit and a plurality of receiving elements, where lengths of the second wires are the same or different. At least one of the control signals is transmitted to the corresponding receiving element. The rest of the control signals are delayed for a preset time and then transmitted to the rest of the receiving elements.

In an embodiment, the related information of the second wire comprises the length of the second wire and a transmission rate of the control signal transmitted in the second wire. Moreover, the preset time is obtained through dividing a difference value between a first length and a second length by the transmission rate of the control signal is transmitted in the corresponding second wire after the delay, the first length is the length of the second wire which the corresponding control signal which is not delayed is transmitted in, the second length is the length of the second wire which the corresponding control signal which is delayed is transmitted in, and the first length is greater than the second length.

In an embodiment, the related information of the second wires comprises periods that the control signals are respectively transmitted to the receiving elements, the preset time is a difference value between a first period and a second period, the first period corresponds to a period of the control signal which is not delayed, the second period corresponds to a period of the control signal which is delayed, and the first period is greater than the second period.

In an embodiment, the signal timing control method further comprises the following steps. A plurality of test signals are transmitted to the receiving elements. The receiving elements generate a response signal respectively according to the test signals. According to the response signals, the related information of the second wires corresponding to the receiving elements is calculated, and the related information of the second wires is stored.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The detailed features and advantages of the disclosure are described below in great detail through the following embodiments, the content of which is sufficient for those skilled in the art to understand the technical content of the disclosure and to implement the disclosure accordingly. Based on the content of the specification, the claims, and the drawings, those skilled in the art can easily understand the relevant objectives and advantages of the disclosure.

Figure 1:
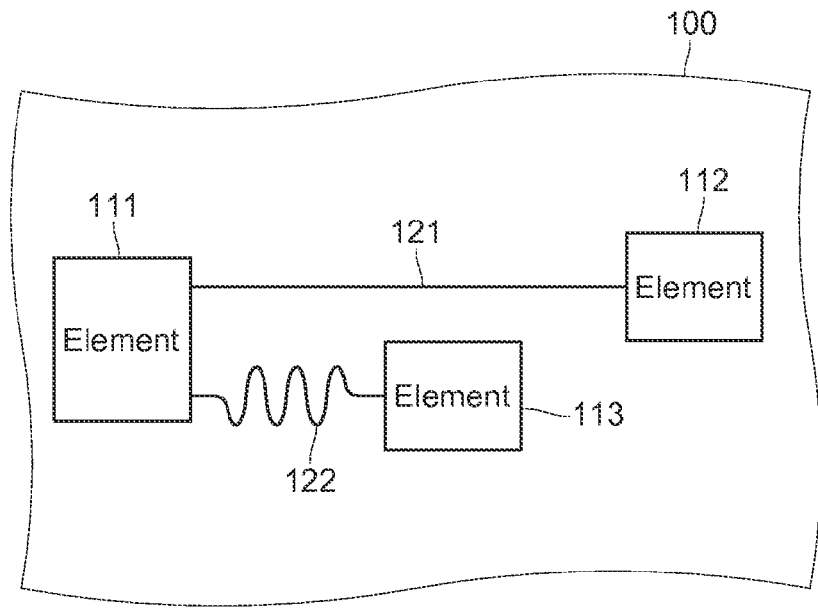
FIG. 1 is a schematic partial diagram of a common PCB.
Figure 2:
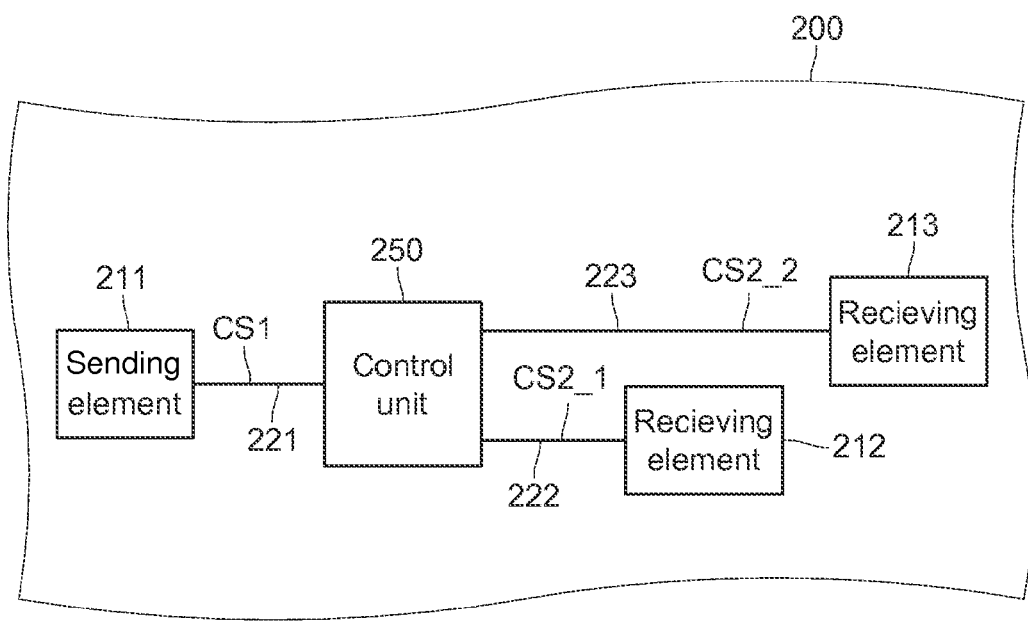
FIG. 2 is a schematic partial diagram of a PCB according to the disclosure.

FIG. 2 illustrates a schematic partial diagram of a printed circuit board (PCB) according to the disclosure. The PCB 200 is, for example, a host board of a computer system or of a server. The PCB 200 includes a sending element 211, receiving elements 212 and 213, a first wire 221, second wires 222 and 223, and a control unit 250. The sending element 211 is coupled to the control unit 250 via the first wire 221. The receiving element 212 is coupled to the control unit 250 via the second wire 222, and the receiving element 213 is coupled to the control unit 250 via the second wire 223. The signal transmission between the receiving elements 212 and 213 is controlled by the control unit 250, so that the receiving elements 212 and 213 are capable of synchronously receiving a sending signal generated by the sending element 211.

To describe the disclosure clearly, an example that using two receiving elements, namely the receiving elements 212 and 213 is taken, but this disclosure is not limited thereby. In some embodiments, the disclosure can use three or more than three receiving elements. The sending element 211, the receiving element 212, and the receiving element 213 are respectively, for example, a central processing unit, (CPU), a baseboard management controller (BMC), and a hard disk. In some embodiments, the sending element 211, the receiving element 212 and the receiving element 213 are other circuit elements, for example, a serial advanced technology attachment (SATA) interface, a peripheral component interconnection express (PCIE) interface and a universal serial bus (USB) interface.

The control unit 250 is, for example, a micro controller unit, (MCU), and is provided with a comparison table. The comparison table stores related information of the second wires 222 and 223. The control unit 250 is configured to receive a sending signal CS1 generated by the sending element 211 and the related information of the second wires 222 and 223 through the first wire 221, so as to generate a plurality of control signals, namely the control signals CS2_1 and CS2_2, corresponding to the sending signal CS1. The related information of the second wires 222 and 223 includes, for example, lengths of the second wires 222 and 223 and transmission rates of the control signals CS2_1 and CS2_2 respectively transmitted in the second wires 222 and 223.

Subsequently, the control unit 250 sends at least one of the control signals CS2_1 and CS2_2 to one corresponding receiving element. For example, the control unit 250 sends the control signal CS2_2 to the receiving element 213. Thereafter, the control unit 250 delays the rest of the control signals for a preset time, and sends the delayed control signals to the rest of the receiving elements. For example, the control unit 250 sends the control signal CS2_1 to the receiving element 212.

In some embodiments, the lengths of the second wires 222 and 223 are the same and whereby the time of outputting the control signals CS2_1 and CS2_2 from the control unit 250 are the same.

In some embodiments, the lengths of the second wires 222 and 223 are different and whereby the time of outputting the control signals CS2_1 and CS2_2 from the control unit 250 are different.

For example, the length of the second wire 222 is 2 mils, the transmission rate of the control signal CS2_1 in the second wire 222 is 2 nanoseconds, the length of the second wire 223 is 4 mils, and the transmission rate of the control signal CS2_2 transmitted in the second wire 223 is 3 nanoseconds. In this embodiment, the preset time is obtained through dividing a difference value between a first length and a second length by a transmission rate of one delayed control signal transmitted in the corresponding the second wire. The first length is a length of the second wire which one corresponding control signal which is not delayed is transmitted in. The second length is a length of the second wire which one corresponding control signal which is delayed is transmitted in. The first length is greater than the second length.

After receiving the sending signal CS1, the control unit 250 generates the control signals CS2_1 and CS2_2 according to the related information of the second wires 222 and 223. The control unit 250 sends at least one of the control signals CS2_1 and CS2_2 to the corresponding receiving element, that is, the receiving element 213 (the hard disk), and also delays the rest of the control signals CS2_1 and CS2_2 for a preset time to send the delayed control signal to the receiving element 212 (the BMC).

The control unit 250 is capable of by looking up the comparison table, obtaining that the lengths of the second wires 222 and 223 are 2 mils and 4 mils respectively, and that the transmission rates of the control signals CS2_1 and CS2_2 respectively transmitted in the second wires 222 and 223 are 2 nanoseconds and 3 nanoseconds respectively. The control unit 250 calculates the preset time through dividing a difference value between the second length (corresponding to the second wire 222) and the first length (corresponding to the second wire 223) by the transmission rate of the delayed control signal CS2_2 transmitted in the second wire 223, that is, (4-2)/2=1 nanosecond. Therefore, the preset time is 1 nanosecond.

In other words, the control unit 250 outputs the control signal CS2_2 first, and transmits the control signal CS2_2 to the receiving element 213 through the second wire 223. Subsequently, after the preset time of 1 nanosecond which the control signal CS2_1 is delayed for, the control unit 250 outputs the control signal CS2_1, and transmits the control signal CS2_1 to the receiving element 212 through the second wire 222. Therefore, the control signals CS2_1 and CS2_2 generated by the control unit 250 arrive at the receiving elements 212 and 213 at the same time, so as to synchronize the signal timing.

For another example, the related information of the second wire 222 is the same as that of the second wire 223, that is, both of the lengths of the second wires 222 and 223 are 4 mils and both of the transmission rates of the control signals CS2_1 and CS2_2 respectively transmitted in the second wires 222 and 223 are 2 nanoseconds. After receiving the sending signal CS1, the control unit 250 generates the control signals CS2_1 and CS2_2 at the same time, that is, the control signals CS2_1 and CS2_2 are outputted at the same time. Then, the control signals CS2_1 and CS2_2 are respectively transmitted to the receiving elements 212 and 213 at the same time through the second wires 222 and 223 respectively, so as to synchronize the signal timing.

In some embodiments, the information of the second wire 222 and of the second wire 223 includes periods that the control signals CS2_1 and CS2_1 are respectively transmitted to the receiving elements 212 and 213.

For example, the period of the control signal CS2_1 is transmitted to the receiving element 212 is 2 nanoseconds, and the period of the control signal CS2_2 transmitted to the receiving element 213 is 3 nanoseconds. The preset time is a difference value between a first period and a second period. The first period corresponds to a period of the control signal which is not delayed (for example, the control signal CS2_2), the second period corresponds to the period of the control signal which is delayed (for example, the control signal CS2_1). The first period is greater than the second period.

The control unit 250 is capable of obtaining that the periods that the control signals CS2_1 and CS2_2 are respectively transmitted to the receiving elements 212 and 213 are 2 nanoseconds and 3 nanoseconds, by looking up the comparison table, so as to calculate a difference value between the period (corresponding to the first period) of the control signal CS2_2 and the period (corresponding to the second period) of the control signal CS2_1, that is, (3-2)=1 nanosecond. Therefore, the preset time is 1 nanosecond.

In other words, the control unit 250 outputs the control signal CS2_2 first, and transmits the control signal CS2_2 to the receiving element 213 via the second wire 223. After the preset time of 1 nanosecond, which the control signal CS2_1 is delayed for, the control unit 250 outputs the control signal CS2_1, and transmits the control signal CS2_1 to the receiving element 212 via the second wire 222. Therefore, the control signals CS2_1 and CS2_2 generated by the control unit 250 are respectively transmitted to the receiving elements 212 and 213 at the same time, so as to synchronize the signal timing.

Furthermore, the control unit 250 is capable of generating a plurality of test signals. The test signals are transmitted to the receiving elements 212 and 213 respectively through the second wires 222 and 223. After receiving the test signals, the receiving elements 212 and 213 respectively respond to the corresponding test signal to generate the corresponding response signal respectively, and send the response signals to the control unit 250.

Subsequently, the control unit 250 analyzes and calculates the related information of the second wires 222 and 223 respectively corresponding to the receiving elements 212 and 213, according to the response signals, and stores the related information of the second wires 222 and 223. In other words, the control unit 250 is capable of calculating the lengths of the second wires 222 and 223 and the transmission rates of the control signals CS2_1 and CS2_2 respectively transmitted in the second wires 222 and 223, according to the time of outputting the test signals and the time of receiving the response signals.

In some embodiments, the related information of the second wires 222 and 223 is obtained after the layout of the PCB 200 is completed, and the obtained related information of the second wires 222 and 223 is stored in a control unit 250 in advance. Thus, the signal timing may be synchronized when the PCB 200 operates.

Figure 3:
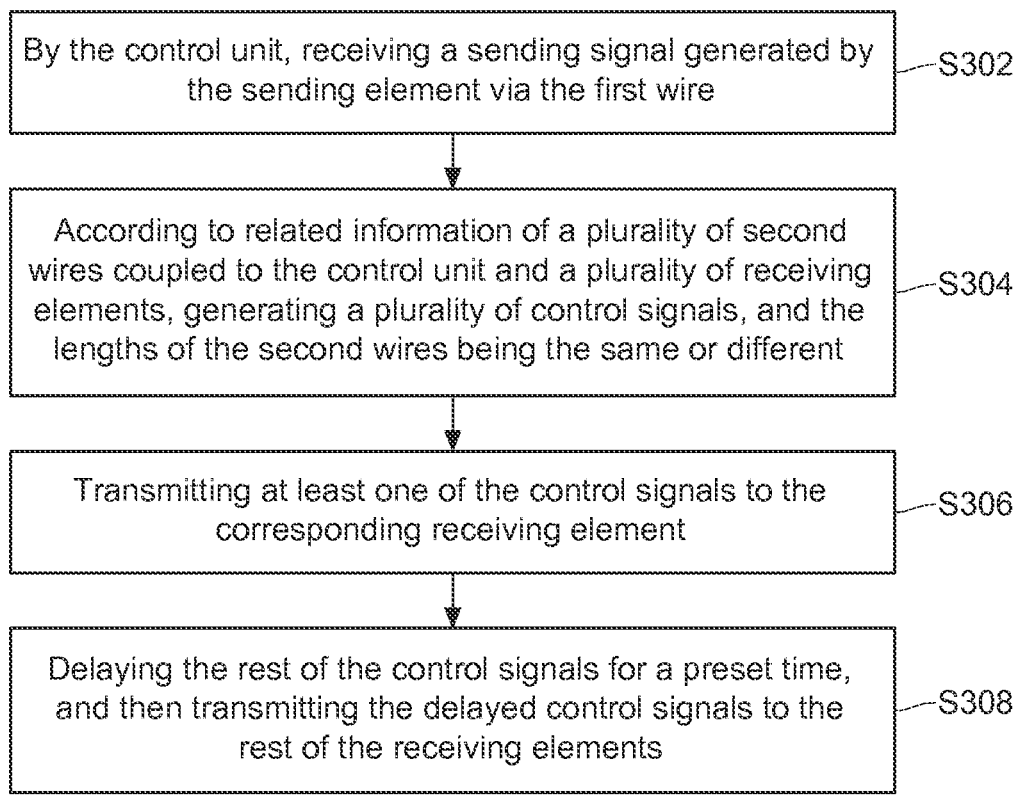
FIG. 3 is a flowchart of a signal timing control method of a PCB according to the disclosure.

FIG. 3 illustrates a flowchart of a signal timing control method of a PCB according to the disclosure. In step S302, a sending signal generated by the sending element is received by a control unit receives via a first wire. In step S304, a plurality of control signals are generated, according to related information of a plurality of second wires coupled to the control unit and a plurality of receiving elements, where lengths of the second wires are the same or different. In step S306, at least one of the control signals is transmitted to the corresponding receiving element. In step S308, the rest of the control signals are delayed for a preset time, and then are transmitted to the rest of the receiving elements.

In some embodiments, the related information of the second wires includes the lengths of the second wires and the transmission rates of the control signals transmitted in the second wires. Moreover, the preset time is obtained through dividing a difference value between a first length and a second length by a transmission rate of one delayed control signal transmitted in the second wire, where the first length is a length of the second wire which one corresponding the control signal which is not delayed is transmitted in, the second length is a length of the second wire which one corresponding the control signal which is delayed is transmitted in, and the first length is greater than the second length.

In some embodiments, the related information of the second wires includes periods that the control signals are respectively transmitted to the receiving elements. Moreover, the preset time is a difference value between a first period and a second period, where the first period corresponds to the period of the control signal which is not delayed, the second period corresponds to the period of the control signal which is delayed, and the first period is greater than the second period.

Figure 4:
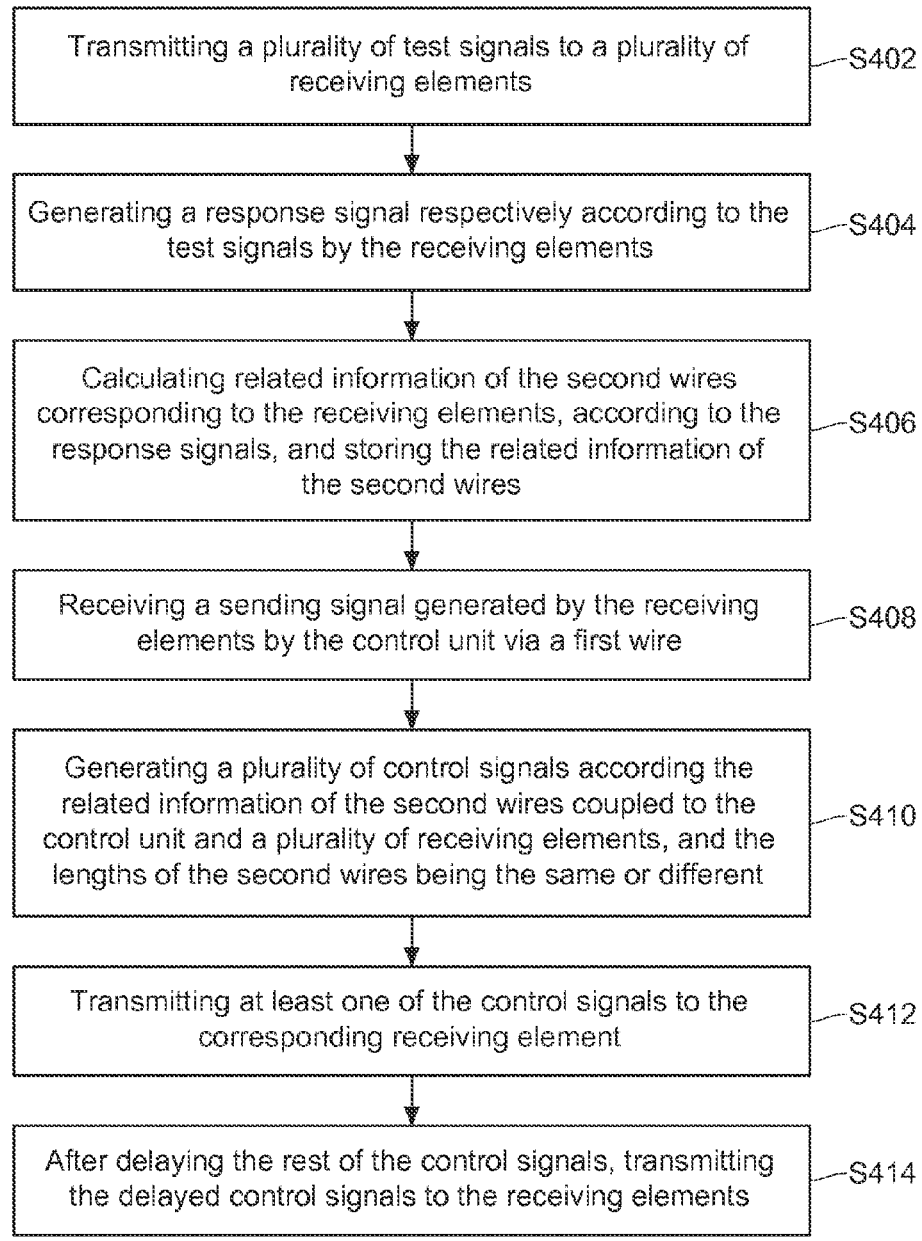
FIG. 4 is another flowchart of a signal timing control method of a PCB according to the disclosure.

FIG. 4 illustrates another flowchart of a signal timing control method of a PCB according to the disclosure. In step S402, a plurality of test signals are transmitted to a plurality of receiving elements. In step S404, the receiving elements generate a response signal respectively according to the test signals. In step S406, related information of the second wires corresponding to the receiving elements is calculated according to the response signals, and is stored.

In step S408, a control unit receives a sending signal generated by a sending element, via a first wire. In step S410, a plurality of control signals are generated according to the related information of a plurality of second wires coupled to the receiving elements and the control unit, where lengths of the second wires are the same or different. In step S412, at least one of the control signals is transmitted to the corresponding receiving element. In step S414, the rest of the control signals are delayed for a preset time, and are transmitted to the rest of the receiving elements.

In some embodiments, the related information of the second wires includes the lengths of the second wires and the transmission rates of the control signals transmitted in the second wires. Moreover, the preset time is obtained through dividing a difference value between a first length and a second length by a transmission rate of one delayed control signal transmitted in the corresponding second wire, the first length is a length of the second wire which the corresponding control signal which is not delayed is transmitted in, the second length is a length of the second wire which the corresponding control signal which is delayed is transmitted in, and the first length is greater than the second length.

In some embodiments, the related information of the second wires includes periods that the control signals are respectively transmitted to the receiving elements. Moreover, the preset time is a difference value between a first period and a second period, the first period corresponds to the period of the control signal which is not delayed, the second period corresponds to the period of the control signal which is delayed, and the first period is greater than the second period.

In the PCB and the signal timing control method thereof according to the embodiments of the disclosure, the control unit receives the sending signal generated by the sending element, generates a plurality of control signals output to the receiving elements, according to the related information of the second wires, and controls the time of outputting the control signals. Thus, the control signals may respectively arrive at the corresponding receiving elements at the same time, thereby synchronize the signal timing. In this way, the complexity of the layout design may be decreased effectively, and the layout efficiency and utilizable space of the PCB may be increased.

The disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A printed circuit board, comprising:
   a sending element, configured to generate a sending signal;
   a plurality of receiving elements, configured to receive a control signal respectively; and
   a control unit, coupled to the sending element through a first wire and to the receiving elements through a plurality of second wires, provided with a comparison table which stores related information of the second wires, configured to generate the control signals corresponding to the sending signal, according to the related information of the second wires after receiving the sending signal, at least one of the control signals being transmitted to the corresponding receiving element, the rest of the control signals being delayed for a preset time and then transmitted to the rest of the receiving elements,
   wherein the related information of the second wires comprises lengths of the second wires and transmission rates of the control signals transmitted in the second wires, the preset time is obtained through dividing a difference value between a first length and a second length by a transmission rate of one delayed control signal transmitted in corresponding one of the second wires, the first length is a length of the second wire in which the corresponding control signal which is not delayed is transmitted, and the second length is a length of the second wire in which the corresponding control signal which is delayed is transmitted, and the first length is greater than the second length.

2. The printed circuit board according to claim 1, wherein the related information of the second wires comprises periods that the control signals are respectively transmitted to the receiving elements, the preset time is a difference value between a first period and a second period, the first period corresponds to a period of the control signal which is not delayed, the second period corresponds to a period of the control signal which is delayed, and the first period is greater than the second period.

3. The printed circuit board according to claim 1, wherein the control unit transmits a plurality of test signals to the receiving elements, the receiving elements respectively generate a response signal according to the test signals, the control unit calculates the related information of the second wires corresponding to the receiving elements, according to the response signals, and stores the related information of the second wires.

4. A signal timing control method of a printed circuit board, comprising:
   receiving a sending signal generated by a sending element, through a first wire by using a control unit;
   generating a plurality of control signals according to related information of a plurality of second wires coupled to the control unit and a plurality of receiving elements;
   transmitting at least one of the control signals to the corresponding receiving element; and
   delaying the rest of the control signals for a preset time, and transmitting the delayed control signals to the rest of the receiving elements,
   wherein the related information of the second wires comprises lengths of the second wires and transmission rates of the control signals transmitted in the second wires, the preset time is obtained through dividing a difference value between a first length and a second length by a transmission rate of one delayed control signal transmitted in the corresponding second wire, the first length is a length of the second wire which the corresponding control signal which is not delayed is transmitted in, and the second length is a length of the second wire which the corresponding control signal which is delayed is transmitted in, and the first length is greater than the second length.

5. The signal timing control method of the printed circuit board according to claim 4, wherein the related information of the second wires comprises periods of the control signals respectively transmitted to the receiving elements, the preset time is a difference value between a first period and a second period, the first period corresponds to a period of the control signal which is not delayed, the second period corresponds to a period of the control signal which is delayed, and the first period is greater than the second period.

6. The signal timing control method of the printed circuit board according to claim 4, further comprising:
   transmitting a plurality of test signals to the receiving elements;
   generating a response signal respectively according to the test signals by the receiving elements; and
   calculating the related information of the second wires corresponding to the receiving elements, according to the response signals, and storing the related information of the second wires.

* * * * *